US012730148B2

(12) United States Patent
Rajpathak et al.

(10) Patent No.: US 12,730,148 B2
(45) Date of Patent: Sep. 8, 2026

(54) LOW POWER AND AREA CLOCK MONITORING CIRCUIT USING RING DELAY ARRANGEMENT

(71) Applicant: NVIDIA Corporation, Santa Clara, CA (US)

(72) Inventors: Kedar Rajpathak, Santa Clara, CA (US); Tezaswi Raja, Santa Clara, CA (US)

(73) Assignee: NVIDIA Corporation, Santa Clara, CA (US)

( * ) Notice: Subject to any disclaimer, the term of this patent is extended or adjusted under 35 U.S.C. 154(b) by 563 days.

(21) Appl. No.: 18/295,493

(22) Filed: Apr. 4, 2023

(65) Prior Publication Data

US 2024/0337690 A1 Oct. 10, 2024

(51) Int. Cl.

*G01R 31/317* (2006.01)
*G05B 19/4155* (2006.01)
*G06F 1/14* (2006.01)

(52) U.S. Cl.

CPC ... *G01R 31/31727* (2013.01); *G05B 19/4155* (2013.01); *G06F 1/14* (2013.01); *G05B 2219/32388* (2013.01)

(58) Field of Classification Search

CPC ......... G06F 1/04; G06F 1/14; G05B 19/4155; G05B 2219/32388; G01R 31/31727

See application file for complete search history.

(56) References Cited

U.S. PATENT DOCUMENTS

| | | | |
|---|---|---|---|
| 3,329,831 A | | 7/1967 | Abramson et al. |
| 3,972,320 A | | 8/1976 | Kalman |
| 3,990,007 A | * | 11/1976 | Hohhof .................. G01R 23/15 324/76.62 |
| 4,696,019 A | | 9/1987 | Tulpule et al. |
| 5,497,110 A | | 3/1996 | Smith |
| 5,657,361 A | * | 8/1997 | Inagaki ................ G01R 23/005 327/48 |
| 6,687,844 B1 | * | 2/2004 | Zhang ....................... G06F 1/10 713/503 |
| 6,895,525 B1 | | 5/2005 | Wilkie et al. |
| 7,242,223 B1 | | 7/2007 | Alon |
| 7,391,240 B2 | * | 6/2008 | Yamasaki ................ H03K 5/19 331/74 |
| 9,336,074 B2 | * | 5/2016 | Chebruch ........... G06F 11/0751 |
| 10,241,537 B2 | * | 3/2019 | Li .......................... H03K 3/017 |
| 10,848,140 B1 | * | 11/2020 | Joshi ........................ H03K 5/19 |
| 12,255,655 B2 | * | 3/2025 | Fiedler ................. G01R 31/088 |
| 2002/0029117 A1 | | 3/2002 | Ito et al. |
| 2003/0154043 A1 | | 8/2003 | Singh |

(Continued)

*Primary Examiner* — Vincent H Tran

(57) ABSTRACT

Circuitry and a method of operating a clock monitoring circuit for monitoring a clock signal is disclosed. The method comprises generating a train of pulses corresponding to a duration of respective phases of a clock signal, counting a number of pulses in respective generated pulse trains, determining (using the number of pulses) when durations of subsequent phases of the clock signal lengthen, determining (using the number of pulses) when durations of the subsequent phases of the clock signal shorten, and providing a clock abnormality detect (CAD) signal when the clock signal either lengthens or shortens. The number of pulses in each respective pulse train is indicative of the duration of the respective phases of the clock signal.

20 Claims, 12 Drawing Sheets

(56) References Cited

U.S. PATENT DOCUMENTS

2006/0132190 A1 6/2006 Driediger et al.
2013/0222068 A1 8/2013 Yoshimura et al.
2014/0035560 A1* 2/2014 Olmos ..................... G06F 1/14 324/76.41
2015/0355250 A1* 12/2015 Wataru .................. H03K 17/56 327/419
2016/0041212 A1* 2/2016 Darbinyan ....... G01R 31/31708 327/33
2018/0046213 A1* 2/2018 Sakurai ..................... G06F 1/04
2019/0130666 A1 5/2019 Matsuura et al.
2020/0072885 A1* 3/2020 Jain ........................ H03K 3/037
2020/0321966 A1* 10/2020 Masuda ................. H03K 19/20
2020/0326373 A1* 10/2020 Dickens ......... G01R 31/318328
2023/0324460 A1 10/2023 Liao et al.
2024/0160520 A1 5/2024 Oak

* cited by examiner

LOW POWER AND AREA CLOCK MONITORING CIRCUIT USING RING DELAY ARRANGEMENT

TECHNICAL FIELD

This application is directed, in general, to monitoring clock signals and, more specifically, to detecting abnormalities in those clock signals.

BACKGROUND

Most digital systems rely on a clock signal in order to function. For example, virtually all modern computing platforms-such as, e.g., mobile devices, desktop computers, and rack-mounted compute nodes in data centers-depend on a system clock signal to execute instructions that enable them to perform their intended functions.

A typical system clock signal can be generated by a circuit that includes a quartz crystal to ensure very accurate and stable oscillations. When properly functioning, the clock signal oscillates between two opposite state phases corresponding, respectively, to a "high" voltage level (e.g., a "high" state or a "high" phase) and a "low" voltage level (e.g., a "low" state or a "low" phase). Usually a clock signal oscillates at a fixed clock frequency, in which a single oscillation cycle corresponds to a fixed clock period having a duration that depends on the fixed clock frequency and includes both the high phase and low phase. In most digital systems, the clock signal is designed to oscillate with a 50% duty cycle. That is, during each clock cycle, the clock signal is designed to exhibit a stable high phase for one half of the clock period and a stable low phase for the other half of the clock period. These states repeat in a strictly alternating fashion from one clock cycle to the next. In some digital systems, the clock signal may be designed to oscillate with a duty cycle other than 50%.

In any such digital systems, one type of clock abnormality occurs when the clock stops oscillating entirely (e.g., a clock "stop"). Another type of clock abnormality occurs when the clock exhibits a duty cycle other than the expected duty cycle (e.g., a clock "glitch"). Other clock abnormalities occur, e.g., when a clock cycle is missed or when the clock frequency increases or decreases. Any of these clock abnormalities can be cause for concern in a digital system because their occurrence may cause the digital system to behave unexpectedly. These abnormalities can occur naturally, e.g., influenced by physical phenomena impingement on the clock signals. Additionally, these abnormalities can occur as a result of a malicious intended alteration of the clock signals which create vulnerabilities to security attacks that are designed to exploit the clock timing of the digital system.

It is desirable, therefore, to detect clock abnormalities if and when they occur and to respond to them quickly.

SUMMARY

In one aspect, a clock monitoring circuit for monitoring a clock signal is disclosed. In one embodiment, the clock monitoring circuit comprises two ring pulse generators, two n-bit counters each connected to a respective one of the two ring pulse generators, a clock slow detection (CSD) circuit, a clock fast detection (CFD) circuit, and a logic circuit. Each ring pulse generator is configured to generate a train of pulses corresponding to a duration of separate phases of a clock signal. Each of the two n-bit counters is configured to count a number of pulses in respective pulse trains generated by the two ring pulse generators where a count of the number of pulses in each respective pulse train is indicative of a duration of the respective phases of the clock signal. The CSD circuit is configured to assert a CSD signal when durations of subsequent phases of the clock signal lengthen. The CFD circuit is configured to assert a CFD signal when durations of subsequent phases of the clock signal shorten. The logic circuit is configured to provide a clock abnormality detect (CAD) signal when either the CSD signal or the CFD signal is asserted.

In another aspect, an integrated circuit (IC) is disclosed. The IC comprises at least one processing subsystem and at least one clock monitoring circuit for monitoring a clock signal coupled to the at least on processing subsystem and a clock signal externally generated from the IC or a plurality of clock signals generated internal to the IC. In one embodiment, the clock monitoring circuit comprises two ring pulse generators, two n-bit counters each connected to a respective one of the two ring pulse generators, a clock slow detection (CSD) circuit, a clock fast detection (CFD) circuit, and a logic circuit. Each ring pulse generator is configured to generate a train of pulses corresponding to a duration of respective phases of the clock signal. Each of the two n-bit counters is configured to count a number of pulses in respective pulse trains generated by the two ring pulse generators where a count of the number of pulses in each respective pulse train is indicative of a duration of the respective phases of the clock. The CSD circuit is configured to assert a CSD signal when durations of subsequent phases of the clock signal lengthen. The CFD circuit is configured to assert a CFD signal when durations of subsequent phases of the clock signal shorten. The logic circuit is configured to provide a clock abnormality detect (CAD) signal when either the CSD signal or the CFD signal is asserted.

In another aspect, a method of operating a clock monitoring circuit for monitoring a clock signal is disclosed. The method comprises generating a train of pulses corresponding to a duration of respective phases of a clock signal, counting a number of pulses in respective generated pulse trains, determining (using the number of pulses) when durations of subsequent phases of the clock signal lengthen, determining (using the number of pulses) when durations of the subsequent phases of the clock signal shorten, and providing a clock abnormality detect (CAD) signal when the clock signal either lengthens or shortens. The number of pulses in each respective pulse train is indicative of the duration of the respective phases of the clock signal.

In another aspect, a method of manufacturing an integrated circuit (IC) for monitoring a clock signal is disclosed. The method comprises forming two ring pulse generators, two n-bit counters, a clock slow detection (CSD) circuit, a clock fast detection (CFD) circuit, and a logic function. Each of the two ring pulse generators is configured to generate a train of pulses corresponding to a duration of respective phases of a clock signal. Each of the two n-bit counters is connected to a respective one of the two ring pulse generators and each is configured to count a number of pulses in respective pulse trains generated by the two ring pulse generators where a count of number of pulses in each respective pulse train is indicative of a duration of the respective phases of the clock signal. The CSD circuit is configured to assert a CSD signal when durations of subsequent phases of the clock signal lengthen. The CFD circuit is configured to assert a CFD signal when durations of subsequent phases of the clock signal shorten. The logic function is configured to provide a clock abnormality detect (CAD) signal when either the CSD signal or the CFD signal is asserted.

In another aspect, an autonomous machine is disclosed. The autonomous machine comprises at least one processing subsystem and at least one clock monitoring circuit for monitoring a clock signal coupled to the at least one processing subsystem and a clock signal externally generated from the IC or a plurality of clock signals generated internal to the IC In one embodiment, the clock monitoring circuit comprises two ring pulse generators, two n-bit counters, a clock slow detection (CSD) circuit, a clock fast detection (CFD) circuit, and a logic function. Each of the two ring pulse generators is configured to generate a train of pulses corresponding to a duration of respective phases of a clock signal. Each of the two n-bit counters is connected to a respective one of the two ring pulse generators and each is configured to count a number of pulses in respective pulse trains generated by the two ring pulse generators where a count of number of pulses in each respective pulse train is indicative of a duration of the respective phases of the clock signal. The CSD circuit is configured to assert a CSD signal when durations of subsequent phases of the clock signal lengthen. The CFD circuit is configured to assert a CFD signal when durations of subsequent phases of the clock signal shorten. The logic function is configured to provide a clock abnormality detect (CAD) signal when either the CSD signal or the CFD signal is asserted.

In another aspect, a clock monitoring circuit for monitoring a clock signal is disclosed. In one embodiment, the clock monitoring circuit comprises two ring pulse generators, separate n-bit counters, and a logic circuit. Each of the two ring pulse generators is configured to generate a train of pulses corresponding to a duration of respective phases of the clock signal. Each of the separate n-bit counters is connected to a respective one of the two ring pulse generators and each is configured to count a number of pulses in respective pulse trains generated by the two ring pulse generators, where a count of the number of pulses in each respective pulse train is indicative of a duration of the respective phases of the clock signal. The logic circuit is configured to provide a clock abnormality detect (CAD) signal when durations of subsequent phases of the clock signal lengthen or shorten according to the count of the number of the pulses.

BRIEF DESCRIPTION OF THE DRAWINGS

Reference is now made to the following descriptions taken in conjunction with the accompanying drawings, in which.

DETAILED DESCRIPTION

Figure 1:
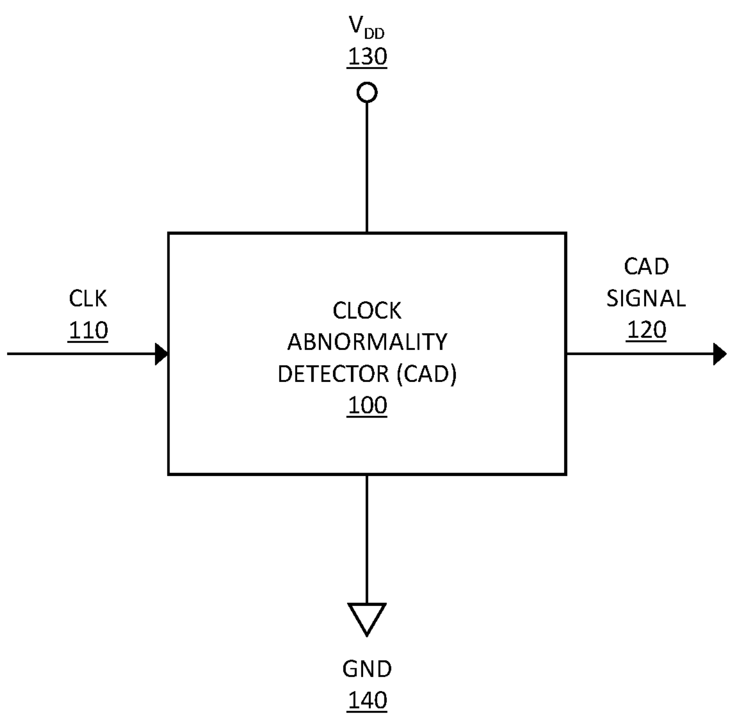
FIG. 1 illustrates an embodiment of a clock abnormality detector (CAD) in which at least a portion of the circuitry and methods disclosed herein can be implemented.

As noted above, most digital systems rely on a clock to provide at least one clock signal so that the digital systems, e.g., mobile devices, desktop computers, and rack-mounted compute nodes in data centers, execute instructions that enable them to perform their intended functions. Typically this clock consists of a circuit including a quartz crystal external to processors of the digital system. Additionally, a clock signal generated by this external circuit employing the quartz crystal can be used to internally generate a number of other clock signals for use by the processors of the digital system, e.g., by using phase-locked loop (PLL) circuits to generate PLL clocks used by the processors of the digital system. In most instances, a plurality of clock signals must be generated for the digital system.

In some cases, the external clock circuit can be physically accessed, allowing for manipulation of the clock signal generated by the external clock circuit. An entity, e.g., a hacker, can maliciously alter the clock signal thereby causing the above-noted clock abnormalities. As a result, the hacker can access the digital system by this malicious manipulation of the clock signal thereby creating security concerns for the digital system.

In other scenarios, the clock signals generated by the external circuit utilizing the quartz crystal and/or the internal clock signals, e.g., the PLL clocks generated by the internal PLLs, can be influenced by physical phenomena, e.g., gamma rays impinging on the clock signals which can cause the above-noted clock abnormalities, much like the hacker can cause the clock abnormalities as described above. In digital systems where safety is significantly important, the clock signals, either the externally generated clocks signals or the internally generated clock signals, such as the PLL clock signals, or both, must be verified to be free of any influence from natural phenomena influences. Examples of such digital systems where safety is significantly important are autonomous driving computing platforms, robotic systems, and autonomous vision computing platforms. In some cases various industry standards for clock signal integrity need to be met. For example, in autonomous driving applications, conformance to the ISO 26262 standard is required in many instances.

In at least both cases above, i.e., the security concerns to avoid malicious influence on clock signals input to digital systems and the safety concerns to avoid natural phenomena influence on clock signals externally provided to or internally generated by digital systems, monitoring of the clock signals is desired to determine if the clock signal is as expected or not, i.e., to detect the above-noted clock abnormalities, where the monitoring of the clock signal can yield an alert if there is a difference between the received clock signal and an expected clock signal. Further, it is desired that no false positive alerts are generated by the monitoring of the clock signals and that the monitoring of the clock signals is reliable, detecting the clock abnormalities in every instance. Additionally, it is necessary that the monitoring of each of the clock signals can be implemented using a very small area of silicon with a very low consumption of power and works without post-silicon tuning. And lastly, it would be advantageous that a same design for monitoring the clock signals can be effective over a broad range of operating frequencies, e.g., from about 32 kHz to over 800 MHz without significant alteration.

This disclosure provides a low power and area clock monitoring circuit using a ring delay arrangement, a system employing the circuit, a method of operating the circuit, and a method of manufacturing the circuit to monitor a clock signal for the above-noted clock abnormalities. The disclosed clock monitoring circuit takes up very little area of silicon, e.g., in some embodiments an area savings of up to 96% as compared to conventional clock monitoring circuits can be achieved with similar quality metrics. The disclosed clock monitoring circuit consumes very little power, e.g., in some embodiments a power savings of up to 50% as compared to conventional clock monitoring circuits can be achieved with similar quality metrics.

The disclosed low power and area clock monitoring circuit includes at least a pair ring pulse generators. Each of the ring pulse generators include a plurality of edge detectors. The edge detectors can be, e.g., conventional edge detector circuits. A clock signal, e.g., the external clock signal or one of the internal PLL clock signals disclosed above, is input to a first of the plurality of edge detectors of a first of the at least two ring pulse generators. An inverse of the clock signal is input to a first of the edge detectors of the second of the at least two ring pulse generators. These clock signals oscillate between two opposite state phases corresponding, e.g., to the "high" phase and a "low" phase disclosed above at a fixed clock frequency, in which a single oscillation cycle corresponds to a fixed clock period having a duration that depends on the fixed clock frequency and is the sum of a duration of the high phase and low phase of the two opposite state phases of the clock signal. In the first ring pulse generator, the first of the edge detectors generates a first pulse with a unit pulse width of a first pulse train upon detecting an edge of the clock signal input to the ring pulse generator where the edge of the clock signal input to the ring pulse generator is a falling edge or rising edge. The output of the first edge detector of the ring pulse generator is fed to a second edge detector of the first ring pulse generator, much like the clock signal input to the first edge detector of the first ring pulse generator.

As with the first edge detector, the second edge detector generates a pulse with the unit pulse width of a second pulse train upon detecting an edge received from the first edge detector. In some embodiments, the second (and subsequent) edge detector generates a pulse of differing pulse widths rather than the unit pulse width. Moreover, as with the first edge detector, the second edge detector generates its pulse upon detecting either a falling or rising edge. As with the first edge detector of the ring pulse generator, the output of the second edge detector of the ring pulse generator is fed to a third edge detector of the first ring pulse generator. The third edge detector generates a pulse with the unit pulse width or, in some embodiments, with a differing pulse width, of a third pulse train upon detecting an edge of the pulse from the second edge detector where the edge can be either a falling or rising edge.

At this point, the pulse generated by the third edge detector is fed back to the first edge detector, thereby implementing the ring delay arrangement, whereupon the first edge detector generates a subsequent pulse of the unit pulse width of the first pulse train upon detecting an edge of the pulse generated by the third edge detector fed back to the first edge detector. In some embodiments, the width of the subsequent pulse of first pulse train generated by the first edge detector is of a same pulse width as the first generated pulse or, in other embodiments, the subsequent pulse generated by the first edge detector is of a different pulse width from the first generated pulse width. The output of the first edge detector is input to the second edge detector to generate in a similar manner a subsequent pulse of the second pulse train and the output of the second edge detector is input to the third edge detector to generate in a similar manner a subsequent pulse of the third pulse train. Of course, while this example describes three edge detectors in the first ring pulse generator generating three separate pulse trains, the first ring pulse generator may include any number of edge detectors generating any number of separate pulse trains. This process continues until the first ring pulse generator detects another edge of the clock signal input to the ring pulse generator.

A detection resolution of the duration of either of the low or high phases of the clock signal being monitored by the clock monitoring circuit is determined by both a width of the pulses in each of the pulse trains generated by edge detectors of either ring pulse generator, e.g., the unit pulse width, and a number of edge detectors in each of the ring pulse generators. For example, a shorter pulse width of the generated pulse trains and a larger number of edge detectors in the ring pulse generate will yield a greater resolution of the duration of either the low or high phases of the clock signal being monitored by the clock monitoring circuit. As there conventionally is some nominal variation of clock signals, care must be taken in considering the detection resolution and a corresponding design of the ring pulse generators in order to prevent false positive alerts.

The low power and area clock monitoring circuit further includes a counter circuit that comprises two n-bit counters. One of the pulse trains from the first ring pulse generator (e.g., for the low phase of the clock signal input to the clock monitoring circuit) is selected to be input to a first one of the two n-bit counters of the counter circuit and one of the pulse trains from second ring pulse generator (e.g., for the high phase of the clock signal input to the clock monitoring circuit) is selected to be input to a second one of the two n-bit counters of the counter circuit. The first n-bit counter counts a number of pulses for, e.g., the low phase of the clock signal input to the clock monitoring circuit, i.e., a low phase count ("LPC"). The second n-bit counter counts a number of pulses for, e.g., the high phase of the clock signal input to the clock monitoring circuit, i.e., a high phase count ("HPC").

The LPC and HPC of the n-bit counters are employed to determine if the clock signal has slowed (i.e., the duration of a subsequent phase of the clock signal input to the clock monitoring circuit is longer) and if the clock signal has sped up (i.e., the duration of a subsequent phase of the clock signal input to the clock monitoring circuit is shorter). These detections are performed by circuits of the low power and area clock monitoring circuit. For example, a clock slow detect ("CSD") circuit determines if the clock signal input to the clock monitoring circuit has slowed and, e.g., a clock fast detect ("CFD") circuit determines if the clock signal input to the clock monitoring circuit has sped up.

The above-disclosed low power and area clock monitoring circuit detects the above-defined clock abnormalities, specifically, missed single clock pulses, shorter pulses, longer pulses, glitches, and, importantly, cycle to cycle variation of the clock signal. Moreover, the above-disclosed low power and area clock monitoring circuit does not generate false positive alerts and detects clock abnormalities for every clock cycle. The above-disclosed low power and area clock monitoring circuit requires significantly smaller area and has significantly smaller power consumption requirements than conventional clock monitoring circuits. As such, many of the above-disclosed low power and area clock monitoring circuits can be deployed on a single integrated circuit (IC) to monitor many different clock signals and, thus, clock signals at many different locations on the IC may be monitored at a same time as well. The above-disclosed low power and area clock monitoring circuit does not require silicon tuning after deployment. And the above-disclosed low power and area clock monitoring circuit can operate with very slow clocks, e.g., 32 kHz clocks and with very high clock frequencies, e.g., 800 MHz clocks in a small area with only a change in a width of the above-described counter/comparator circuits to account for the differing clock frequencies. Moreover, the above-disclosed low power and area clock monitoring circuit can also detect supply voltage glitches and over voltage supply voltage conditions.

Instances of the above-disclosed clock monitoring circuit can be deployed on an IC, each instance deployed to monitor one of a plurality of clocks used in the IC. The clock signal being monitored can be the above-described clock signal generated by clock circuit external to the IC that includes the quartz crystal. Or the clock signal being monitored can be clocks generated internally in the IC by, e.g., PLL generated PLL clocks. The externally generated clock signals and/or the internally generated clock signals are supplied to various processing subsystems of the IC. Examples of the subsystems of the IC can be one or more central processing units ("CPUs"), one or more graphics processing units ("GPUs"), one or more memory controllers, or any other subsystems that are typically present in a computing device. The CAD signal generated by the clock monitoring circuit on the IC can be input to the various processing subsystems of the IC where the various processing subsystems act on the CAD signal. For example, for the above-mentioned security concerns, some or all of the various processing subsystems could reset upon receipt of the CAD signal. And, e.g., for the above-mentioned safety concerns some or all of the various processing subsystems could log instances of the CAD signal and, in some instances, reset the various processing subsystems.

Referring to the drawings, specifically FIG. 1 is a block diagram illustrating an example of a low power and area clock monitoring circuit using a ring delay arrangement 100, otherwise termed as a clock abnormality detector (CAD). A clock signal 110 to be monitored by the CAD, e.g., the clock signal generated by an external circuit employing the quartz crystal or one of the clock signals internally generated by the PLL circuits as disclosed above, are input to the CAD 100. When the CAD 100 detects one of the above-disclosed clock anomalies, e.g., missed single clock pulses, shorter pulses, longer pulses, glitches, and cycle to cycle variation of the clock signal, the CAD 100 outputs a clock abnormality detect signal (CAD signal) 120. Typically, voltage supplied to CAD 100 is a $V_{DD}$ 130 voltage supply and, further, the CAD 100 is typically connected to ground (GND) return path 140.

Figure 2:
FIG. 2 illustrates an embodiment of a system using the CAD detector.
Figure 2:
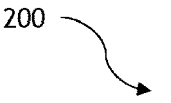
Figure 2:
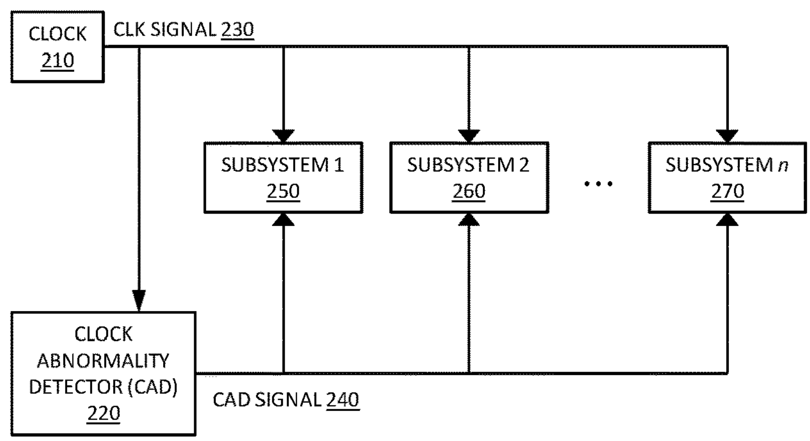

FIG. 2 illustrates a block diagram of an example system 200 utilizing the clock monitoring circuit 100 of FIG. 1. System 200 can be the above disclosed mobile devices, desktop computers, rack-mounted compute nodes in data centers, autonomous driving computing platforms, robotic systems, and autonomous vision computing platforms, etc. System 200 includes a clock circuit 210 which generates clock signal 230. Clock signal 230 can be, e.g., the clock signal generated by an external circuit employing the quartz crystal or one of the clock signals internally generated by the PLL circuits as disclosed above, similar to clock 110 of FIG. 1. Clock signal 230 is fed to clock abnormality detector (CAD) 220 which is similar to CAD 100 of FIG. 1. System 200 also includes a plurality of subsystems such as subsystem 1 250, subsystem 2 260, through subsystem n 270 as depicted in FIG. 2. Subsystems 1-*n* correspond to, e.g., the various processing subsystems disclosed above, e.g., the one or more central processing units ("CPUs"), one or more graphics processing units ("GPUs"), one or more memory controllers, or any other subsystems that are typically present in a computing device. Clock signal 230 is also fed to subsystems 1-*n* (e.g., subsystems 250, 260, 270).

As with CAD 100 of FIG. 1, CAD 220 of FIG. 2 detects clock abnormalities, e.g., one of the above-disclosed clock anomalies, e.g., missed single clock pulses, shorter pulses, longer pulses, glitches, and cycle to cycle variation of the clock signal. When CAD 220 detects one or more of these clock anomalies, CAD 220 generates CAD signal 240 which is fed back to subsystems 1-*n* (e.g., subsystems 250, 260, 270). When one or more of subsystems 250, 260, 270 receives CAD signal 230 from CAD 220, the one or more subsystem can, e.g., reset the subsystem (typically, e.g., in the above-disclosed security concerns) or log instances of the CAD signal 240 (typically, e.g., in the above-disclosed safety concerns). Of course, the subsystems 250, 260, 270, when receiving the CAD signal 240 from CAD 220 can perform other operations.

Figure 3:
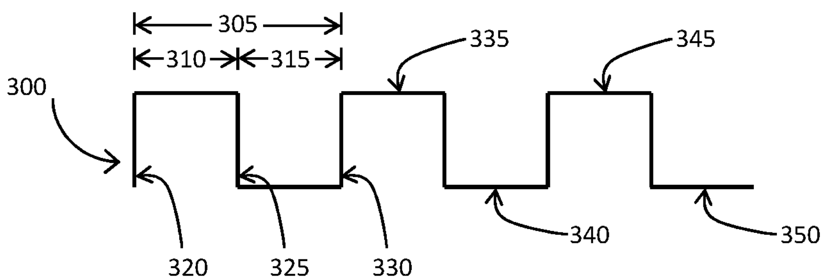
FIG. 3 illustrates an embodiment of a clock signal monitored by the CAD.

Clock signals such as those disclosed above may take a variety of forms. FIG. 3 illustrates an example clock signal 300. Clock signal 300 exhibits a cycle 305 during normal operation. A clock cycle corresponds to one clock period. A duration of the clock period for a given clock signal depends on a frequency at which the clock signal oscillates. For example, a clock signal oscillating at a frequency of 1 GHz exhibits $10^9$ cycles per second and exhibits a clock period having a duration of $10^{-9}$ seconds.

As disclosed above, each clock cycle 305 includes two opposite-state phases 310/315 in the sense that one of them corresponds to a clock state having a "high" voltage level (a "high phase" or "high clock state") while the other corresponds to a clock state having a "low" voltage level (a "low phase" or "low clock state"). As used herein, "high" and "low" are relative terms. A high voltage level may be, but need not be, e.g., substantially equal to a voltage supply level, e.g., $V_{DD}$. A low voltage level may be, but need not be, substantially equal to a ground voltage. A high voltage level may correspond to, e.g., a Boolean "true" value while a low voltage may correspond to, e.g., a Boolean "false" level or vice versa, depending on a design convention used for a given system.

Each phase of a clock signal has a start or a beginning and each phase has an end. For example, high phase 310, as depicted in FIG. 3 has a start or beginning 320 and an end 325. Similarly, low phase 315 has a start or beginning 325 and an end 330. A clock "edge" as used herein refers to a transition from one clock state, or clock phase, to another in a clock cycle. A clock edge may have one of two directions depending on whether the corresponding transition is from a low state (or phase) to a high state (or phase), e.g., a "rising edge" or from a high state (or phase) to a low state (or phase), e.g., a "falling edge." For example, the beginning 320 of clock phase 310 corresponds to a rising edge of clock signal 300 and the end 325 of clock phase 310 corresponds to a falling edge of clock signal 300. In clock signals that oscillate between opposite-state phases, the end of a previous phase may be equivalent to the start or beginning of a subsequent phase that immediately follows the previous phase. In embodiments, the start or beginning of any clock phase may be detected using a variety of techniques such as by detecting a clock edge, or by sensing a high or a low voltage level in the clock signal, or both.

The phrase "duty cycle" as used herein refers to a ratio between a high phase duration for a clock signal and the cycle period for the clock signal. Clock signal 300 is an example of a clock signal having a 50% duty cycle since each of opposite-state phases 310, 315 has the same duration. Thus, the duration of high phase 310 is half that of cycle period 305. "Phase instance" as used herein refers to any one occurrence of any phase of a clock signal. For purposes of illustration, six phase instances of clock signal 300 are labeled in FIG. 3. High phase 310 represents a first phase instance of clock signal 300 and low phase 315 represents a second phase instance of clock signal 300. Similarly, phases 335, 340, 345, and 350 represent third, fourth, fifth, and sixth phase instances of clock signal 300, respectively. In this sense, clock signal 300 represents a series of clock phase instances. Moreover, phases 310, 335, and 345 correspond to first, second, and third instances of the high phase of clock signal 300, while phases 315, 340, and 350 correspond to first, second, and third instances of the low phase of clock signal 300.

Figure 4:
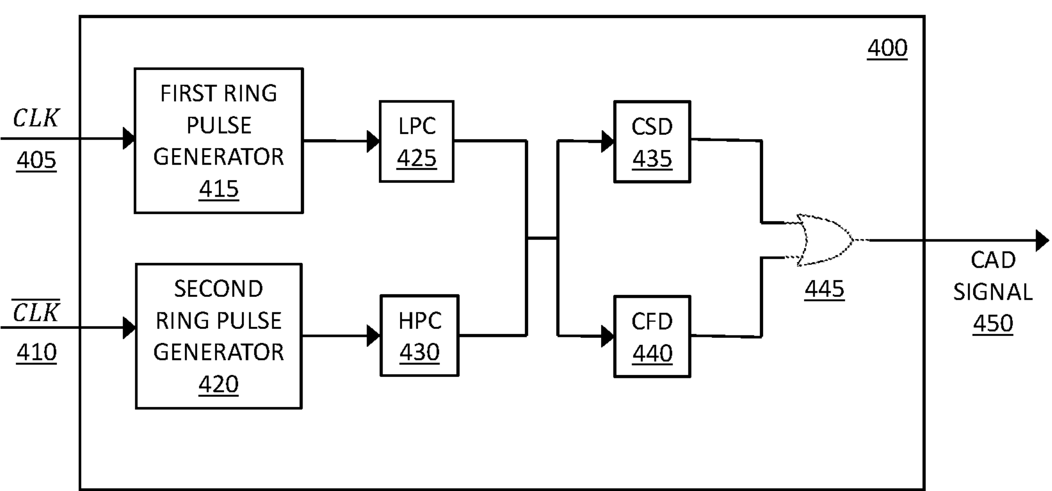
FIG. 4 illustrates an embodiment of a block diagram of the CAD.

FIG. 4 illustrates a block diagram of another example of the clock monitoring circuit of FIG. 1. Similar to the low power and area clock monitoring circuit with ring delay arrangement disclosed above (and similar to CAD 100 of FIG. 1 and CAD 220 of FIG. 2), clock monitoring circuit 400 includes first ring pulse generator 415, second ring pulse generator 420, low phase count (LPC) counter 425, high phase count (HPC) counter 430, clock slow detect (CSD) circuit 435, clock fast detect (CFD) circuit 440, and logic function 445. As disclosed above and detailed below, clock monitoring circuit 400 receives both a clock input signal (CLK) 405 and its inverse signal ($\overline{\text{CLK}}$) 410. This clock signal 405 (and its inverse 410) is similar to that disclosed above, e.g., either a clock signal generated by an external circuit that includes a quartz crystal or an internally PLL generated clock signal. As disclosed below, clock monitoring circuit 400 outputs a clock abnormality signal 450 which indicates if there is an abnormality, e.g., one of the clock anomalies disclosed above, in the CLK signal 405.

Figure 5:
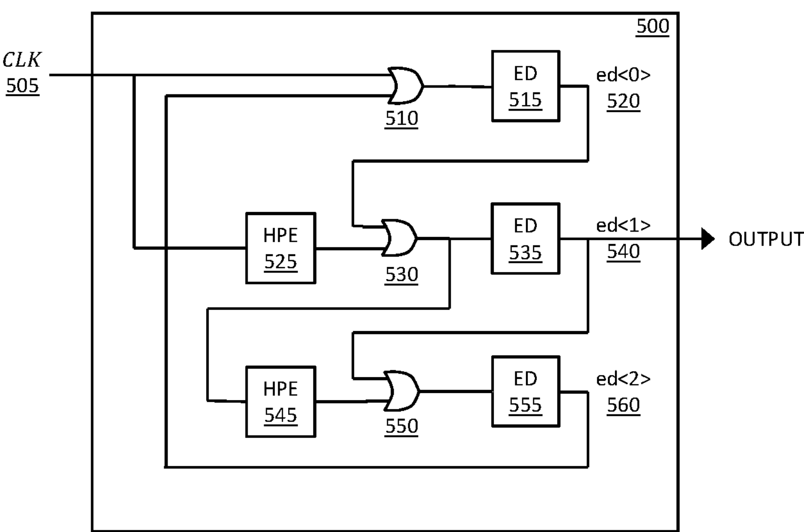
FIG. 5 illustrates an embodiment of a ring pulse generator of the CAD.

FIG. 5 illustrates a block diagram 500 of an example of first ring pulse generator 415 of the clock monitoring circuit 400 of FIG. 4. Block diagram 500 of FIG. 5 also illustrates an example of second ring pulse generator 420 of FIG. 4 (except that its input is the inverse of the CLK signal, e.g., $\overline{\text{CLK}}$). Of course, other circuit configurations could be used to implement the functionality of ring pulse generators 415 or 420.

Clock signal (CLK) 505 is input to ring pulse generator 500. Clock signal 505 is similar to CLK signal 110 of FIG. 1, CLK signal 230 of FIG. 2, CLK signal 300 of FIG. 3, and CLK signal 405 of FIG. 4 (or $\overline{\text{CLK}}$ 410). CLK signal 505 is input to a first logic function, e.g., first OR-gate 510 of ring pulse generator 500. The output of first OR-gate 510 is fed to first edge detector (ED) 515 of ring pulse generator 500. The output of first ED 515 is first pulse train 520 (ed<0>). Clock signal 505 is also fed to first high phase extender (HPE) 525 of ring pulse generator 500. First pulse train 520 and an output of first HPE 525 are fed to a second logic function, e.g., second OR-gate 530 of ring pulse generator 500. The output of second or-gate 530 is fed to second edge detector 535 of ring pulse generator 500. The output of second ED 535 is second pulse train 540 (ed<1>). The output of second OR-gate 530 is also fed to second HPE 545 of ring pulse generator 500. Second pulse train 540 and an output from second HPE 545 are fed to a third logic function, e.g., third OR-gate 550 of ring pulse detector 500. The output of third OR-gate 550 is fed to third edge detector 555 of ring pulse generator 500. The output of third ED 555 is third pulse train 560 (ed<2>). Third pulse train 560 is fed back as another input to first OR-gate 510. Second pulse train 540 is output from ring pulse generator 500.

Ring pulse generator 500, as disclosed above, includes three edge detectors. In other embodiments, ring pulse generator could include 1, 2, 4, or more edge detectors. Furthermore, ring pulse generator 500, as disclosed above, outputs second pulse train 540. In other embodiments, ring pulse generator 500 outputs first pulse train 520 or third pulse train 560 rather than second pulse train 540. Moreover, in other embodiments of ring pulse generator 500 with more than three edge detectors, a pulse train from any one of the more than three edge detectors are output from ring pulse generator 500.

As disclosed above, a detection resolution of the duration of either a high phase or low phases of the clock signal being monitored by the clock monitoring circuit is determined by the number of edge detectors in the ring pulse generator and a larger number of edge detectors in the ring pulse generate will yield a greater resolution of the duration of either the low or high phases of the clock signal being monitored by the clock monitoring circuit.

Figure 6:
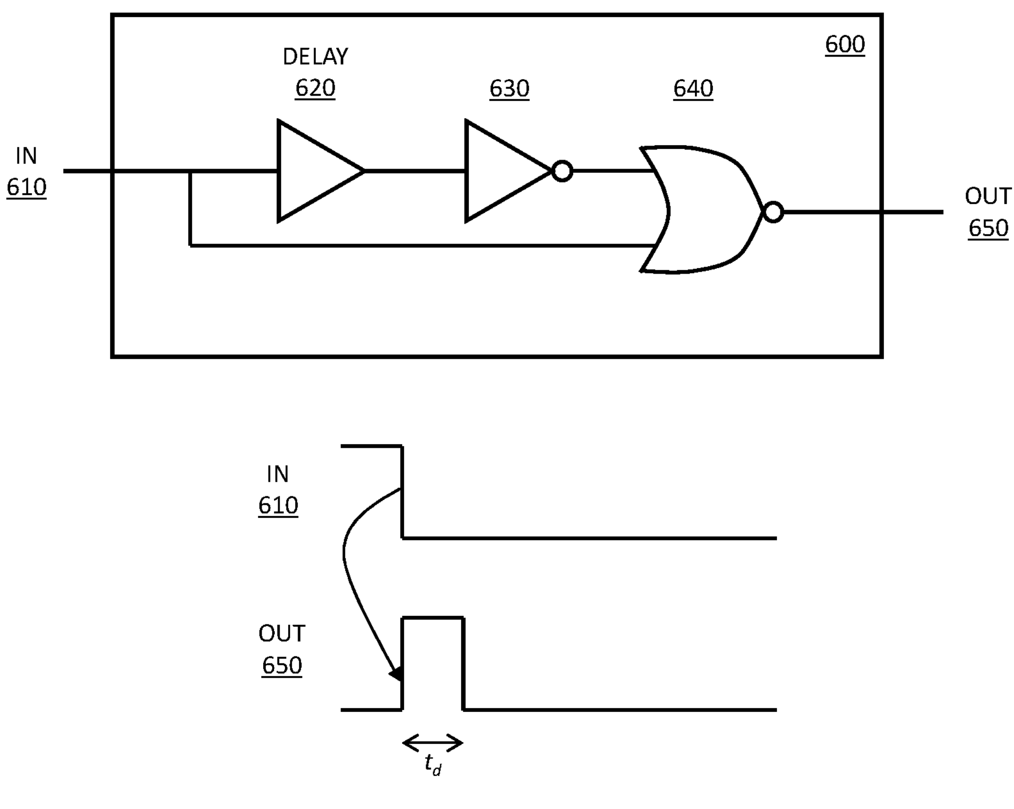
FIG. 6 illustrates an embodiment of an edge detector of the ring pulse generator.

FIG. 6 illustrates a block diagram 600 of, e.g., any of the edge detectors 515, 535, 555 of FIG. 5. Edge detector 600 is configured to detect a falling edge of a clock signal input to ED 600. A block diagram for an edge detector detecting a rising edge of a clock signal input to the edge detector is of similar structure. Of course, other circuit configurations could be used to implement the functionality of edge detector 600 (to detect either a falling or rising edge of a clock signal input to the edge detector).

A signal input to edge detector 600, e.g., input 610, from, e.g., OR-gate 510, 530, or 550 of FIG. 5 is fed to delay element 620 and an input of logic function 640, e.g., NOR-gate 640. The output of delay element 620 is fed to inverter 630. The output of inverter 630 is fed to another input of logic function 640, e.g., NOR-gate 640. The output of logic function 640, e.g., NOR-gate 640 is output 650 of edge detector 600. As depicted in the associated timing diagram of FIG. 6, the structure of edge detector 600 disclosed above functions to assert a high signal on the output of edge detector 600 for a duration of ta upon detection of a falling edge of a signal input to edge detector 600. The width of ta is based on the electrical characteristics of delay element 620, inverter 630, and logic function 640, e.g., NOR-gate 640.

Figure 7:
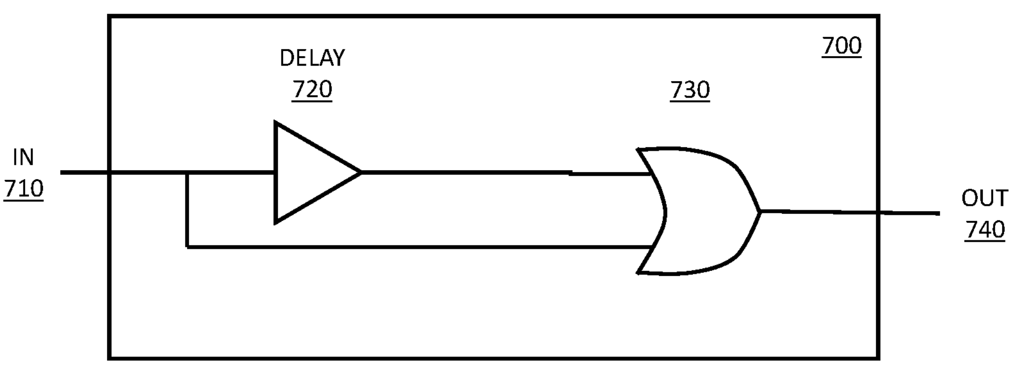
FIG. 7 illustrates an embodiment of a high phase extender of the ring pulse generator.

FIG. 7 illustrates a block diagram 700 of an example of, e.g., either of HPE 525 or HPE 545 of FIG. 5. Of course other circuit configurations could be used to implement the functionality of HPE 700. A signal input to HPE 700, e.g., input 710 from, e.g., CLK 505 or second OR-gate 530 of FIG. 5 is fed to delay element 720 and an input of logic function 730, e.g., OR-gate 730. The output of delay element

720 is fed to another input of OR-gate 730. The output 740 of OR-gate 730 is the output of HPE 700.

Figure 8:
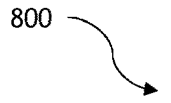
FIG. 8 illustrates an embodiment of a timing diagram of the ring pulse generator.
Figure 8:
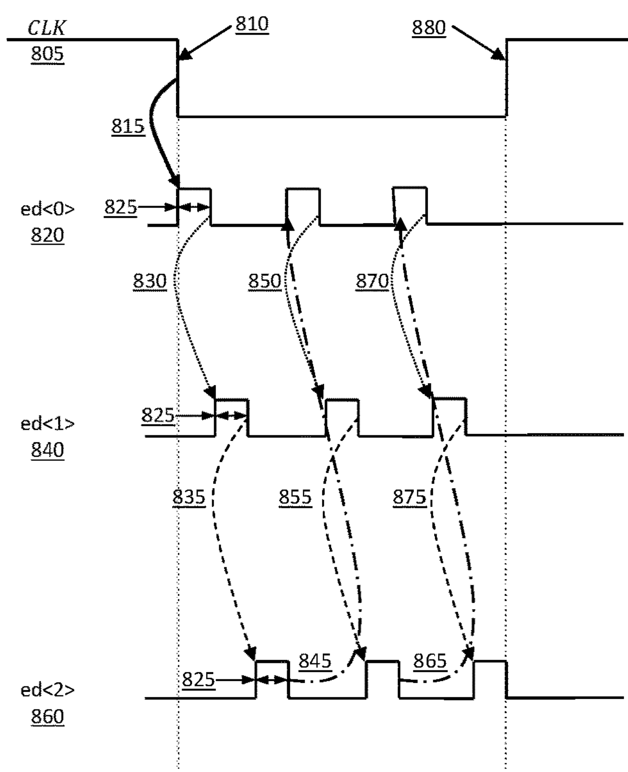

FIG. 8 illustrates a timing diagram 800 of the signals of a ring pulse generator, e.g., ring pulse generator 500 of FIG. 5. Clock signal 805 is similar to, e.g., CLK signal 505 of FIG. 5. First pulse train 820 is similar to, e.g., first pulse train 520 of FIG. 5 (e.g., ed<0>). Second pulse train 840 is similar to, e.g., second pulse train 540 of FIG. 5 (e.g., ed<1>). And third pulse train 860 is similar to, e.g., third pulse train 560 of FIG. 5 (e.g., <2>).

In an example of operation of the disclosed first ring pulse generator of the low power and area clock monitoring circuit, e.g., ring pulse generator 415 of FIG. 4 or ring pulse generator 500 of FIG. 5 as disclosed above, when the first ring pulse generator detects a falling edge (810) of the clock signal input thereto (depicted by arrow 815), a first edge detector of the first ring pulse generator, e.g., edge detector 515 of FIG. 5, outputs a first pulse of a first pulse train, e.g., first pulse train 520 of FIG. 5 or first pulse train 820 of FIG. 8 (ed<0>), with a unit pulse width, e.g., unit pulse width 825. A second edge detector of the first ring pulse generator, e.g., edge detector 535 of FIG. 5, outputs a first pulse of a second pulse train, e.g., second pulse train 540 of FIG. 5 or second pulse train 840 of FIG. 8 (ed<1>), with unit pulse width, e.g., unit pulse width 825, upon detecting a falling edge of the first pulse of the first pulse train received from the first edge detector (depicted by arrow 830). A third edge detector of the first ring pulse generator, e.g., edge detector 555 of FIG. 5, outputs a first pulse of a third pulse train, e.g., third pulse train 560 of FIG. 5 or third pulse train 860 of FIG. 8 (ed<2>), with a unit pulse width, e.g., unit pulse width 825, upon detecting a falling edge of the first pulse second pulse train received from the second edge detector (depicted by arrow 835).

Then, the first edge detector of the first ring pulse generator, e.g., edge detector 515 of FIG. 5, generates a subsequent pulse of the first pulse train with a unit pulse width, e.g., unit pulse width 825, upon detecting a falling edge of the first pulse of the third pulse train received from the third edge detector (depicted by arrow 845). The second edge detector of the first ring pulse generator, e.g., edge detector 535 of FIG. 5, then generates a subsequent pulse of the second pulse train with a unit pulse width, e.g., unit pulse width 825, upon detecting a falling edge of the subsequent pulse of the first pulse train received from the first edge detector (depicted by arrow 850). The third edge detector of the first ring pulse generator, e.g., edge detector 555 of FIG. 5, then generates a subsequent pulse of the third pulse train with a unit pulse width, e.g., unit pulse width 825, upon detecting a falling edge of the subsequent pulse of the second pulse train received from the second edge detector (depicted by arrow 855). This process continues (as depicted by arrows 865, 870, and 875) until the first ring pulse generator detects a rising edge (880) of the clock signal input to the first ring pulse generator. In this example, the first, second and third pulse trains of the first ring pulse generator are generated for a low phase of the clock signal input to the first ring pulse generator.

In a similar manner, a first, second, and third pulse train is generated by the second ring pulse generator of the low power and area clock monitoring circuit, e.g., ring pulse generator 420 of FIG. 4 or ring pulse generator 500 of FIG. 5 as disclosed above. However, this second ring pulse generator generates its first, second, and third pulse trains based on detection by the second ring pulse generator of an edge of an inverse of the clock signal input to the first ring pulse generator, e.g., $\overline{CLK}$. In the example given above, the second ring pulse generator would generate its first, second, and third pulse trains based upon detection of a rising edge of the inverse clock signal input to the second ring pulse generator (inverse of the clock signal input to the first ring pulse generator) and this second ring pulse generator would generate its first, second, and third pulse trains until detection of a falling edge of the inverse clock signal input to the second ring pulse generator. In this example, the first, second and third pulse trains of the second ring pulse generator are generated for a high phase of the clock signal input to the first ring pulse generators.

In most instances, the clock signal input to the second ring pulse generator is the inverse of the clock signal input to the first ring pulse generator. As with the first ring pulse generator, while the above example discloses three edge detectors of the second ring pulse generator generating three separate pulse trains, the second ring pulse generator can include any number of edge detectors to generate any number of separate pulse trains. In some embodiments, the first and second ring pulse generators include a same number of edge detectors and in other embodiments the first and second ring pulse generators include a different number of edge detectors. As with the first ring pulse generator, the second ring pulse generator can generate pulse trains with a same unit pulse width in its respective pulse train or the second ring pulse generator can generate pulse trains with a different unit pulse width in its respective pulse train. And also as with the first ring pulse generator, the second pulse ring generator can generate pulse trains with a same pulse width in each pulse train or the second ring pulse generator can generate differing pulse widths in each pulse train.

Figure 9:
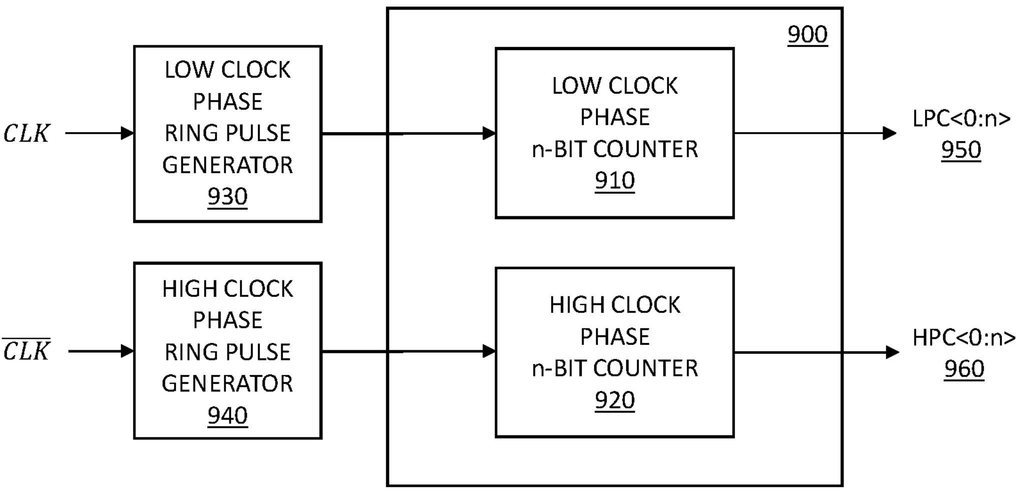
FIG. 9 illustrates an embodiment of a counter circuit of the CAD.

FIG. 9 illustrates a block diagram of an embodiment of counter circuit 900 constructed according to principles of the disclosure. Counter circuit 900 includes, in one embodiment, at least two n-bit counters, e.g., counters 910 and 920. A pulse train from a ring pulse generator, e.g., low clock phase ring pulse generator 930 is input into one of the two n-bit counters of counter circuit 900, e.g., low clock phase counter 910. Low clock phase ring pulse generator 930 is similar to first ring pulse generator 415 of FIG. 4 and ring pulse generator 500 of FIG. 5 as disclosed above. In one embodiment, the pulse train from low clock phase ring pulse generator 930 represents a duration of a low phase of a clock signal, e.g., CLK, input into low clock phase ring pulse generator 930 where a unit pulse width and a number of pulses of the pulse train from low clock phase ring pulse generator 930 are indicative of a duration of a low phase of clock signal CLK. As disclosed above, the pulse train from low clock phase ring pulse generator 930 can be generated by any number of edge detectors contained therein, e.g., pulse trains 520, 540, or 560 from edge detectors 515, 535, or 555, respectively of FIG. 5. The output of low clock phase n-bit counter 910, e.g., LPC <0:n> 950, is a count of pulses for the low phase of clock signal CLK. Low clock phase n-bit counter 910 is reset at a beginning of the low phase of clock signal CLK. Resetting is delayed until after a last pulse has been counted for pulse train from low clock phase ring pulse generator 930.

A pulse train from another ring pulse generator, e.g., high clock phase ring pulse generator 940 is input into another one of the two n-bit counters of counter circuit 900, e.g., high clock phase counter 920. Hight clock phase ring pulse generator 940 is similar to second ring pulse generator 420 of FIG. 4 and ring pulse generator 500 of FIG. 5 as disclosed above. In one embodiment, the pulse train from high clock phase ring pulse generator 940 represents a duration of a high phase of a clock signal, e.g., $\overline{CLK}$, input into high clock phase ring pulse generator 940 where a unit pulse width and a number of pulses of the pulse train from high clock phase ring pulse generator 940 are indicative of a duration of a high phase of clock signal $\overline{CLK}$. As disclosed above, the pulse train from high clock phase ring pulse generator 940 can be generated by any number of edge detectors contained therein, e.g., pulse trains 520, 540, or 560 from edge detectors 515, 535, or 555, respectively of FIG. 5. The output of high clock phase n-bit counter 920, e.g., HPC <0:n> 960, is a count of pulses for the low phase of clock signal $\overline{CLK}$. High clock phase n-bit counter 920 is reset at a beginning of the high phase of clock signal $\overline{CLK}$. Resetting is delayed until after a last pulse has been counted for pulse train from high clock phase ring pulse generator 940.

Thus, the output from a counter circuit, e.g., counter circuit 900, are counts, e.g., LPC<0:n> 950 and HPC<0:n> 960, from two n-bit counters, e.g., low clock phase n-bit counter 910 and high clock phase n-bit counter 920. The counts, e.g., LPC<0:n> 950 and HPC<0:n> 960, each represents a duration of a low phase of a clock signal, e.g., CLK and a high phase of an inverse of clock signal CLK, e.g., $\overline{CLK}$, respectively.

Figure 10:
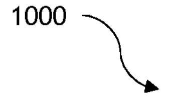
FIG. 10 illustrates an embodiment of a clock slow detect (CSD) signal generator of the CAD.
Figure 10:
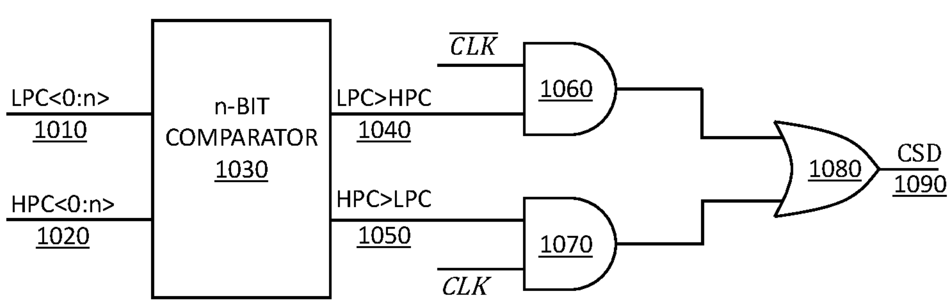

FIG. 10 illustrates an embodiment of a block diagram for a clock slow detect (CSD) signal generator 1000 constructed according to principles of the disclosure. In one embodiment of CSD signal generation circuitry 1000, a counter value, e.g., LPC<0:n> 950 of FIG. 9, representative of a count of pulses for a low phase of a clock signal, e.g., a low phase of clock signal CLK 405 of FIG. 4 is input on input 1010 of CSD signal generator 1000 and a counter value, e.g., HPC<0:n> 960 of FIG. 9, representative of a count of pulses for a high phase of a clock signal, e.g., a high phase of clock signal $\overline{CLK}$ 410 of FIG. 4, is input on input 1020 of CSD signal generator 1000. Low phase clock counter value, e.g., LPC<0:n> 1010, and high phase clock counter value, e.g., HPC<0:n> 1020, are input into n-bit comparator 1030 which compares the counter values. This pulse count value comparison is performed for each cycle of the clock signal. n-bit comparator 1030 outputs two signals.

One signal is indicative that the low phase clock pulse count is greater than the high phase clock pulse count, e.g., LPC<0:n> is greater than HPC<0:n> signal 1040. The other signal output from n-bit comparator 1030 is indicative that the high phase clock pulse count is greater than the low phase clock pulse count, e.g., HPC<0:n> is greater than LPC<0:n> signal 1050. The signal indicative that the low phase clock pulse count is greater than the high phase clock pulse count (i.e., a duration of a low phase of clock signal CLK is greater than a duration of high phase of clock signal $\overline{CLK}$), e.g., LPC>HPC signal 1040, is input to a first logic function, e.g., AND-gate 1060 as is $\overline{CLK}$ signal. The signal indicative that the high phase clock pulse count is greater than the low phase clock pulse count (i.e., a duration of a high phase of clock signal $\overline{CLK}$ is greater than a duration of a low phase of clock signal CLK), e.g., HPC>LPC signal 1050, is input to a second logic function, e.g., AND-gate 1070. An output of the first logic function, e.g., AND-gate 1060, and an output of the second logic function, e.g., AND-gate 1070, is input into a third logic function, e.g., OR-gate 1080. An output of the third logic function, e.g., OR-gate 1080, is the above disclosed CSD signal which is indicative that a clock signal has slowed (i.e., the duration of a subsequent phase of the clock signal is longer than the previous phase).

Figure 11:
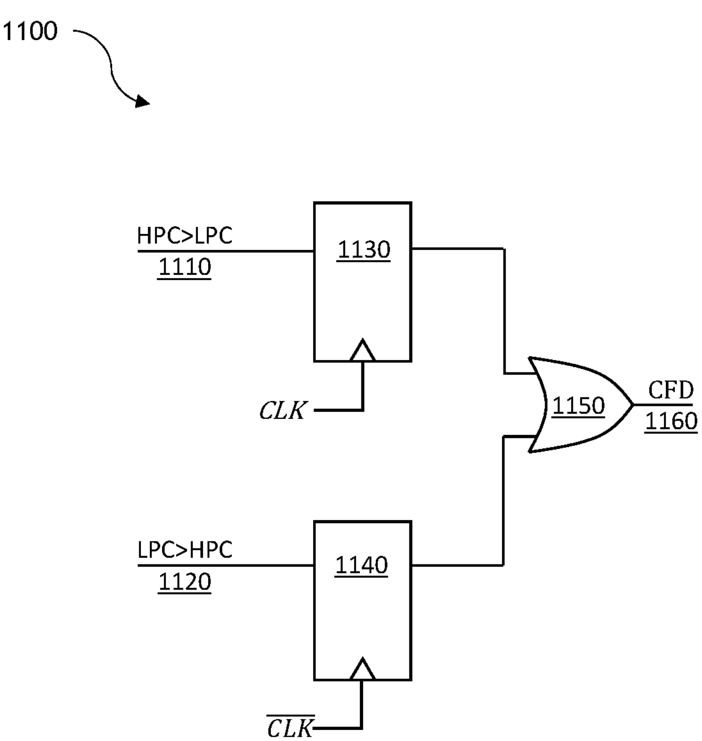
FIG. 11 illustrates an embodiment of a clock fast detect (CFD) signal generator of the CAD.

FIG. 11 illustrates an embodiment of a block diagram for a clock fast detect (CFD) signal generator 1100 constructed according to principles of the disclosure. In one embodiment of CFD signal generator 1100, two signals are input to CFD signal generator 1100. One signal, e.g., signal 1110, indicates that a high phase clock pulse count is greater than a low phase clock pulse count, e.g., similar to signal 1050 of FIG. 10 (which is indicative that a duration of a low phase of a clock signal, e.g., clock signal CLK is greater than a duration of high phase of an inverse clock signal, e.g., clock signal $\overline{CLK}$). Another signal input to clock fast detect (CFD) signal generator 1100, e.g., signal 1120 indicates that a low phase clock pulse count is greater than a low phase clock pulse count, e.g., similar to signal 1040 of FIG. 1040 of FIG. 10 (which is indicative that a duration of a high phase of clock signal $\overline{CLK}$ is greater than a duration of a low phase of clock signal CLK). In one embodiment, these signals are generated by an n-bit comparator as disclosed above with regard to FIG. 10.

Signal 1110, indicative, e.g., that a high phase clock pulse count is greater than a low phase clock pulse count, is input to a first logic function, e.g., D-type flip-flop 1130, as well as clock signal CLK. Signal 1120, indicative, e.g., that a low phase clock pulse count is greater than a low phase clock pulse count, is input to a second logic function, e.g., D-type flip-flop 1140, as well as clock signal $\overline{CLK}$. The outputs of the first logic function, e.g., D-type flip-flop 1130, and the second logic function, e.g., D-type flip-flop 1140, are input to a third logic function, e.g., OR-gate 1150. An output of the third logic function, e.g., OR-gate 1150, is the above disclosed CFD signal which is indicative that a clock signal has sped up (i.e., the duration of a subsequent phase of the clock signal is shorter than the previous phase).

Figure 12:
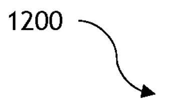
FIG. 12 illustrates an embodiment of a clock abnormality detect (CAD) signal generator.
Figure 12:
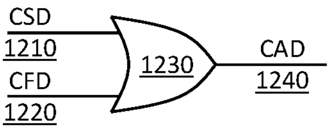

FIG. 12 illustrates an embodiment of a block diagram for a clock abnormality detect (CAD) signal generator 1200 constructed according to principles of the disclosure. In one embodiment of CAD signal generator 1200, a clock slow detect signal, e.g., clock slow detect signal 1210, and a clock fast detect signal, e.g., clock fast detect signal 1220, are input to a logic function, e.g., OR-gate 1230. Clock slow detect signal 1210 is similar to clock slow detect signal 1090 of FIG. 10 and clock fast detect signal 1220 is similar to clock fast detect signal 1160 of FIG. 11. CAD signal generator is similar to logic function 445 of FIG. 4. CAD signal generator 1200 outputs a CAD signal, e.g., CAD signal 1240, if either a clock slow detect signal (e.g., clock slow detect signal 1210) or a clock fast detect signal (e.g., clock fast detect signal 1220) is input to CAD signal generator 1200. While the CSD and CFD generators 1000 and 1100, respectively, detect when a frequency of the clock signal speeds up or slows down as disclosed above, the CSD and CFD generators 1000 and 1100, respectively, will also detect other types of clock abnormalities, i.e., when clock stops oscillating altogether (a clock stop), when the clock exhibits a duty cycle other than that expected (a clock glitch), when a clock cycle is missed, and when there is a cycle to cycle variation of the clock as in each of these clock abnormalities the LPC will differ from the HPC.

Figure 13:
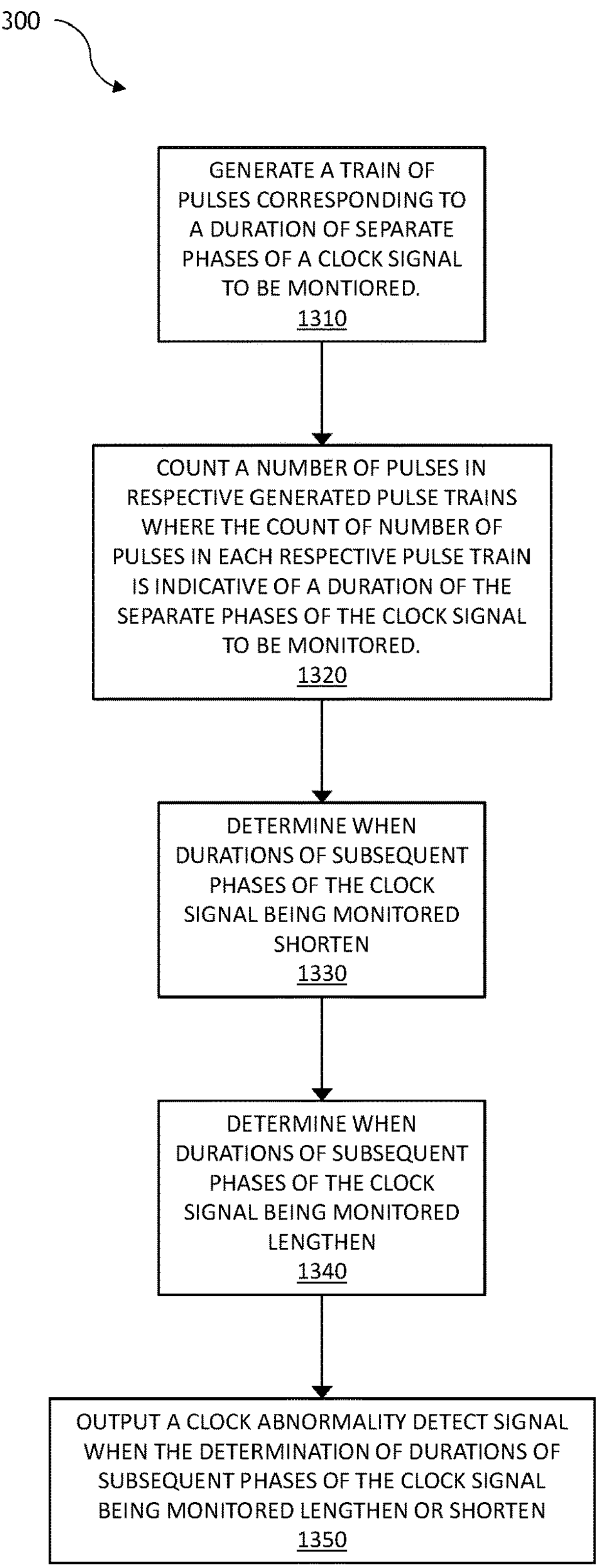
FIG. 13 illustrates a flow diagram of an example method for generating a CAD signal.

FIG. 13 illustrates a flow diagram 1300 of an example method for monitoring a clock signal input to a clock monitoring circuit according to principles of the disclosure. In a step 1310, a train of pulses corresponding to a duration of separate phases of a clock signal to be monitored are generated. In a step 1320 a number of pulses in respective generated pulse trains are counted where the count of the number of pulses in each respective pulse train is indicative of a duration of the separate phases of the clock signal to be monitored. In a step 1330, a determination is made when durations of subsequent phases of the clock signal being monitored shorten. In a step 1340, a determination if made when durations of subsequent phases of the clock signal being monitored lengthen. In a step 1350, a clock abnormality signal is output when the determinations of durations of subsequent phases of the clock signal being monitored lengthen or shorten.

Those skilled in the art to which this application relates will appreciate that other and further additions, deletions, substitutions and modifications may be made to the described embodiments.

What is claimed is:

1. A clock monitoring circuit for monitoring a clock signal, comprising:

two ring pulse generators, each configured to generate a train of pulses corresponding to a duration of respective phases of the clock signal;

two n-bit counters, each connected to a respective one of the two ring pulse generators, configured to count a number of pulses in respective pulse trains generated by the two ring pulse generators, wherein a count of the number of pulses in each respective pulse train is indicative of a duration of the respective phases of the clock signal;

a clock slow detection (CSD) circuit configured to assert a CSD signal when durations of subsequent phases of the clock signal lengthen;

a clock fast detection (CFD) circuit configured to assert a CFD signal when durations of subsequent phases of the clock signal shorten; and a logic circuit configured to provide a clock abnormality detect (CAD) signal when either the CSD signal or the CFD signal is asserted.

2. The clock monitoring circuit as recited in claim 1, wherein the two ring pulse generators each comprise a plurality of edge detector circuits implemented in a ring delay arrangement wherein an output of a last of the plurality of edge detector circuits is fed back to an input of a first of the plurality of edge detector circuits.

3. The clock monitoring circuit as recited in claim 2, wherein:

a first edge detector circuit of the plurality of edge detector circuits of a first ring pulse generator detects a first edge of the clock signal monitored by the clock monitoring circuit and outputs a pulse with a unit pulse width to a subsequent edge detector circuit of the plurality of edge detector circuits; and when the subsequent edge detector circuit detects an edge of the pulse output by the first edge detector, the subsequent edge detector outputs a pulse with the unit pulse width to another subsequent edge detector circuit of the plurality of edge detector circuits of the first ring pulse generator.

4. The clock monitoring circuit as recited in claim 3, wherein:

the first edge of the clock signal monitored by the clock monitoring circuit is a falling edge; and an edge of the pulse output by the first edge detector detected by subsequent edge detector circuits are a falling edge.

5. The clock monitoring circuit as recited in claim 3, wherein the unit pulse width output by the plurality of edge detectors for both the first and second ring pulse generators is a same pulse width.

6. The clock monitoring circuit as recited in claim 1, wherein:

the separate n-bit counters are reset at a beginning of each of their respective separate phases of the clock signal; and the resetting is delayed until after a last pulse is counted for each of the respective phases of the clock signal.

7. The clock monitoring circuit as recited in claim 1, wherein the CSD circuit includes an n-bit comparator that compares an output of each of the separate n-bit counters received by the n-bit comparator to determine when durations of subsequent phases of the clock signal lengthen.

8. The clock monitoring circuit of claim 7, wherein the CFD circuit uses outputs of the n-bit comparator to determine when durations of subsequent phases of the clock signal shorten.

9. An integrated circuit (IC), comprising:

at least one processing subsystem;

at least one clock monitoring circuit for monitoring a clock signal coupled to the at least one processing subsystem and a clock signal externally generated from the IC or a plurality of clock signals generated internal to the IC, wherein the at least one clock monitoring circuit comprises:

two ring pulse generators, each configured to generate a train of pulses corresponding to a duration of respective phases of the clock signal;

two n-bit counters, each connected to a respective one of the two ring pulse generators, configured to count a number of pulses in respective pulse trains generated by the two ring pulse generators wherein a count of number of pulses in each respective pulse train is indicative of a duration of the respective phases of the clock signal;

a clock slow detection circuit (CSD) configured to assert a CSD signal when durations of subsequent phases of the clock signal lengthen;

a clock fast detection (CFD) circuit configured to assert a CFD signal when durations of subsequent phases of the clock signal shorten; and a logic circuit configured to provide a clock abnormality detect (CAD) signal when either the CSD signal or the CFD signal is asserted.

10. The IC as recited in claim 9, further comprising phase-locked loop circuits (PLLs) that generate the plurality of clock signals generated internal to the IC.

11. The IC as recited in claim 9, wherein the at least one processing subsystem includes one or more central processing units (CPUs), one or more graphics processing units (GPUs), or one or more memory controllers.

12. The IC as recited in claim 9, wherein at least some of the at least one processing subsystem reset upon generation of the CAD signal by the clock monitoring circuit.

13. The IC as recited in claim 9, wherein at least some of the at least one processing subsystem log instances of the CAD signal by the clock monitoring circuit.

14. A method of manufacturing an integrated circuit (IC) for monitoring a clock signal, comprising forming:

two ring pulse generators, each configured to generate a train of pulses corresponding to a duration of respective phases of a clock signal;

two n-bit counters, each connected to a respective one of the two ring pulse generators, configured to count a number of pulses in respective pulse trains generated by the two ring pulse generators wherein a count of number of pulses in each respective pulse train is indicative of a duration of the respective phases of the clock signal;

a clock slow detection (CSD) circuit configured to assert a CSD signal when durations of subsequent phases of the clock signal lengthen;

a clock fast detection (CFD) circuit configured to assert a CFD signal when durations of subsequent phases of the clock signal shorten; and a logic circuit configured to provide a clock abnormality detect (CAD) signal when either the CSD signal or the CFD signal is asserted.

15. An autonomous machine, comprising:

at least one processing subsystem; and at least one clock monitoring circuit for monitoring a clock signal coupled to the at least one processing subsystem and an externally generated clock signal or a plurality of internally generated clock signals, wherein the clock monitoring circuit comprises:

two ring pulse generators, each configured to generate a train of pulses corresponding to a duration of respective phases of a clock signal;

two n-bit counters, each connected to a respective one of the two ring pulse generators, configured to count a number of pulses in respective pulse trains generated by the two ring pulse generators wherein a count of number of pulses in each respective pulse train is indicative of a duration of the respective phases of the clock signal;

a clock slow detection (CSD) circuit configured to assert a CSD signal when durations of subsequent phases of the clock signal lengthen;

a clock fast detection circuit (CFD) configured to assert a CFD signal when durations of subsequent phases of the clock signal shorten; and a logic circuit configured to provide a clock abnormality detect (CAD) signal when either the CSD signal or the CFD signal is asserted.

16. The autonomous machine as recited in claim 15, wherein the autonomous machine logs instances of the CAD signal.

17. The autonomous machine as recited in claim 16, wherein some of the at least one processing subsystem reset based on the logged instances of the CAD signal.

18. The autonomous machine as recited in claim 15, wherein the autonomous machine is an autonomous driving computing platform.

19. The autonomous machine as recited in claim 15, wherein the autonomous machine is a robotic computing platform.

20. A clock monitoring circuit for monitoring a clock signal, comprising:

two ring pulse generators, each configured to generate a train of pulses corresponding to a duration of respective phases of the clock signal;

separate n-bit counters, each connected to a respective one of the two ring pulse generators, configured to count a number of pulses in respective pulse trains generated by the two ring pulse generators, wherein a count of the number of pulses in each respective pulse train is indicative of a duration of the respective phases of the clock signal; and a logic circuit configured to provide a clock abnormality detect (CAD) signal when durations of subsequent phases of the clock signal lengthen or shorten according to the count of the number of the pulses.

* * * * *